United States Patent
Suzuki et al.

(10) Patent No.: US 12,093,260 B2
(45) Date of Patent: Sep. 17, 2024

(54) DATA MANAGEMENT SYSTEM

(71) Applicant: FUJI CORPORATION, Chiryu (JP)

(72) Inventors: Mikiya Suzuki, Nishio (JP); Kazuya Kotani, Toyota (JP); Yuta Yokoi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 288 days.

(21) Appl. No.: 17/762,638

(22) PCT Filed: Sep. 30, 2019

(86) PCT No.: PCT/JP2019/038640
§ 371 (c)(1),
(2) Date: Mar. 22, 2022

(87) PCT Pub. No.: WO2021/064831
PCT Pub. Date: Apr. 8, 2021

(65) Prior Publication Data
US 2022/0342878 A1 Oct. 27, 2022

(51) Int. Cl.
*G06F 16/2455* (2019.01)
*G06F 30/392* (2020.01)
*H05K 13/08* (2006.01)

(52) U.S. Cl.
CPC ........ *G06F 16/2455* (2019.01); *G06F 30/392* (2020.01); *H05K 13/081* (2018.08); *H05K 13/086* (2018.08)

(58) Field of Classification Search
CPC . G06F 16/2455; G06F 30/392; H05K 13/081; H05K 13/086
See application file for complete search history.

(56) References Cited

U.S. PATENT DOCUMENTS

2009/0077106 A1* 3/2009 Kawase ............... H05K 13/085

FOREIGN PATENT DOCUMENTS

| JP | 2000124693 A | * | 4/2000 |
| JP | 2003-323487 A1 | | 11/2003 |
| JP | 2003323487 A | * | 11/2003 |

OTHER PUBLICATIONS

International Search Report mailed on Dec. 24, 2019 in PCT/JP2019/038640 filed on Sep. 30, 2019, 2 pages).

* cited by examiner

*Primary Examiner* — Mark D Featherstone
*Assistant Examiner* — Kweku William Halm
(74) *Attorney, Agent, or Firm* — Oblon, McClelland, Maier & Neustadt, L.L.P.

(57) ABSTRACT

The data management system includes a first storage section storing registration data in which component specifying information for specifying a component is associated with shape data, a second storage section storing possession device data, a search section for searching the registration data from the first storage section by using partial information included in at least one of the shape data and the component specifying information as a search condition, and a determination section for performing a suitability determination process of determining whether the shape data included in the registration data in a search result by the search section is suitable for the mounting process using the configuration device, based on the possession device data.

10 Claims, 5 Drawing Sheets

Fig. 4

SETTING OF SEARCH CONDITION AND DETERMINATION CONDITION — 91

SEARCH CONDITION

SHAPE INFORMATION

| COMPONENT SIZE X | 550 ~ 650 [μm] |
| COMPONENT SIZE Y | 250 ~ 350 [μm] |
| COMPONENT SIZE Z | * ~ * [μm] |
| ALLOWABLE ERROR | * |

MODEL OF COMPONENT: *
MOUNTING SUCCESS RATE: *
NUMBER OF LEADS: *

[ CANCEL ]  [ SEARCH ]

DETERMINATION CONDITION

POSSESSION APPARATUS DATA

- ⊟ CONFIGURATION APPARATUS ☑
  - ⊟ MOUNTING HEAD ☑
    - H02-A ☑
    - H03-C ☐
  - ⊞ SUCTION NOZZLE ☑
  - ⊞ COMPONENT CAMERA ☑
  - ⊞ BOARD CAMERA ☐
  - ⊞ HEAD CAMERA UNIT ☐

POSSESSION INFORMATION OF CONFIGURATION APPARATUS

MOUNTING HEAD: H02-A

INTRODUCTION DATE: yy/mm/dd
OPERATION SPECIFICATION: — —

MAINTENANCE: yy/mm/dd

VERSION OF SOFTWARE: Ver2.01
UPDATING DATE OF SOFTWARE: yy/mm/dd 81, 92

Fig. 6

| | | SEARCH RESULT OF SHAPE DATA | | | | | |
|---|---|---|---|---|---|---|---|

SHAPE DATA SUITABLE FOR MOUNTING PROCESS IN POSSESSED PRODUCTION ENVIRONMENT

| No. | RECOMMENDATION LEVEL | COMPONENT SPECIFYING INFORMATION | | APPARATUS INFORMATION | | RESULTANT INFORMATION | RELIABILITY INFORMATION |
|---|---|---|---|---|---|---|---|
| | | MODEL | MANUFACTURER | MANUFACTURER NAME | MODEL | NUMBER OF TIMES OF IMAGE PROCESSING | MOUNTING SUCCESS RATE |
| ☑ 1 | xx1 | xx1 | xx1 | xx1 | xx1 | xx1 | xx1 |
| ☐ 2 | xx2 | xx2 | xx2 | xx2 | xx2 | xx2 | xx2 |
| ☑ 3 | xx3 | xx3 | xx3 | xx3 | xx3 | xx3 | xx3 |

CANCEL   CONDITION SETTING   ACQUISITION

SHAPE DATA UNSUITABLE FOR MOUNTING PROCESS IN POSSESSED PRODUCTION ENVIRONMENT

| No. | SUITABLE LEVEL | UNSUITABLE REASON | INSUFFICIENT CONFIGURATION APPARATUS OR LIKE | COMPONENT SPECIFYING INFORMATION | |
|---|---|---|---|---|---|
| | | | | MODEL | MANUFACTURER |
| ☑ 1 | yy1 | NO APPARATUS | N15-01(NOZZLE) | yy1 | yy1 |
| ☐ 2 | yy2 | BEING USED IN ANOTHER MOUNTING PROCESS | H25-B(MOUNTING HEAD) | yy2 | yy2 |
| ☐ 3 | yy3 | DISCORDANCE BETWEEN VERSIONS | C31-24(COMPONENT CAMERA) | yy3 | yy3 |

DATA MANAGEMENT SYSTEM

TECHNICAL FIELD

The present disclosure relates to a data management system.

BACKGROUND ART

The data management system uses shape data including shape information of a component as a management target (refer to Patent Literature 1). In a mounting process of mounting a component onto a board, a component mounter determines whether a component to be mounted is suitable based on a component shape defined by the shape data. The data management system can store multiple types of corresponding shape data, for example, even for components of the same type, in consideration of a production environment, required accuracy, a process load, and the like.

PATENT LITERATURE

Patent Literature 1: JP-A-2003-323487

BRIEF SUMMARY

Technical Problem

However, when applied to a mounting process, shape data may be limited to a predetermined production environment, for example, designating the type of a suction nozzle to be used. In such a case, for example, when there is an error or shortage in setting a search condition for the shape data, shape data that cannot be used in a production environment possessed by a user can be acquired. While the data management system is required to manage multiple number of various types of shape data, it is demanded to facilitate search and increase convenience.

An object of the present specification is to provide a data management system capable of increasing convenience by simplifying search of shape data and suppressing search errors.

Solution to Problem

The present specification provides a data management system that is used in a mounting process of a component by a component mounter and uses shape data including shape information of the component as a management target, including a first storage section storing registration data in which component specifying information for specifying the component is associated with the shape data, a second storage section storing possession device data possessed by a producer who produces a board product by using the component mounter and indicating a configuration device exchangeably equipped in the component mounter, a search section that searches the registration data from the first storage section by using partial information included in at least one of the shape data and the component specifying information as a search condition, and a determination section that performs a suitability determination process of determining whether the shape data included in the registration data in a search result by the search section is suitable for the mounting process using the configuration device, based on the possession device data.

Advantageous Effects

According to such a configuration, it is possible to obtain a determination result as to whether shape data is suitable for a mounting process based on possession device data stored in advance when the shape data is searched for. Thereby, setting of a search condition when searching shape data can be simplified, and an error in the setting of the search condition can be prevented. Thus, convenience of a data management system capable of searching for shape data can be increased.

BRIEF DESCRIPTION OF DRAWINGS

FIG. 4 is diagram illustrating possession device data and a setting screen of search conditions and determination conditions.

FIG. 6 is a diagram illustrating a display screen presenting a result of the process of searching for the shape data.

DESCRIPTION OF EMBODIMENTS

1. Overview of Data Management System

Figure 1:
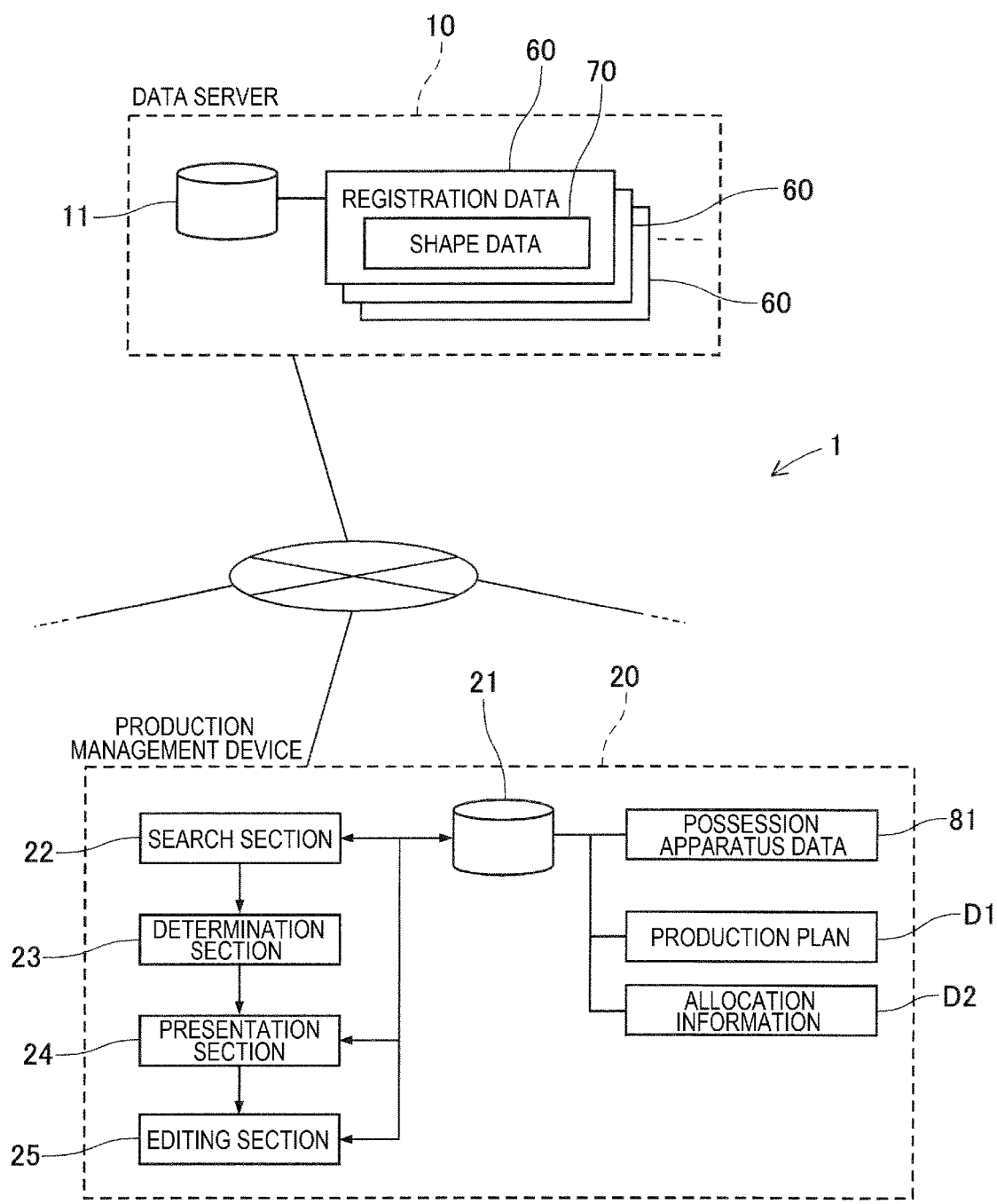
FIG. 1 is a schematic diagram illustrating a data management system according to an embodiment.

Specific embodiments of a data management system will be described below with reference to the accompanying drawings. Data management system 1 manages shape data 70 used in a process of mounting components by component mounter 50. Shape data 70 includes shape information of a component. In the present embodiment, data management system 1 is configured by data server 10 and production management device 20 that are communicably connected to each other via the Internet.

2. Configuration of Component Mounter 50

Component mounter 50 configures a production line for producing a board product together with, for example, multiple types of board work machines including other component mounters 50. The board work machine configuring the production line can include a print machine, an inspection device, a reflow furnace, and the like. Component mounter 50 performs a mounting process of mounting a component onto a board.

Figure 2:
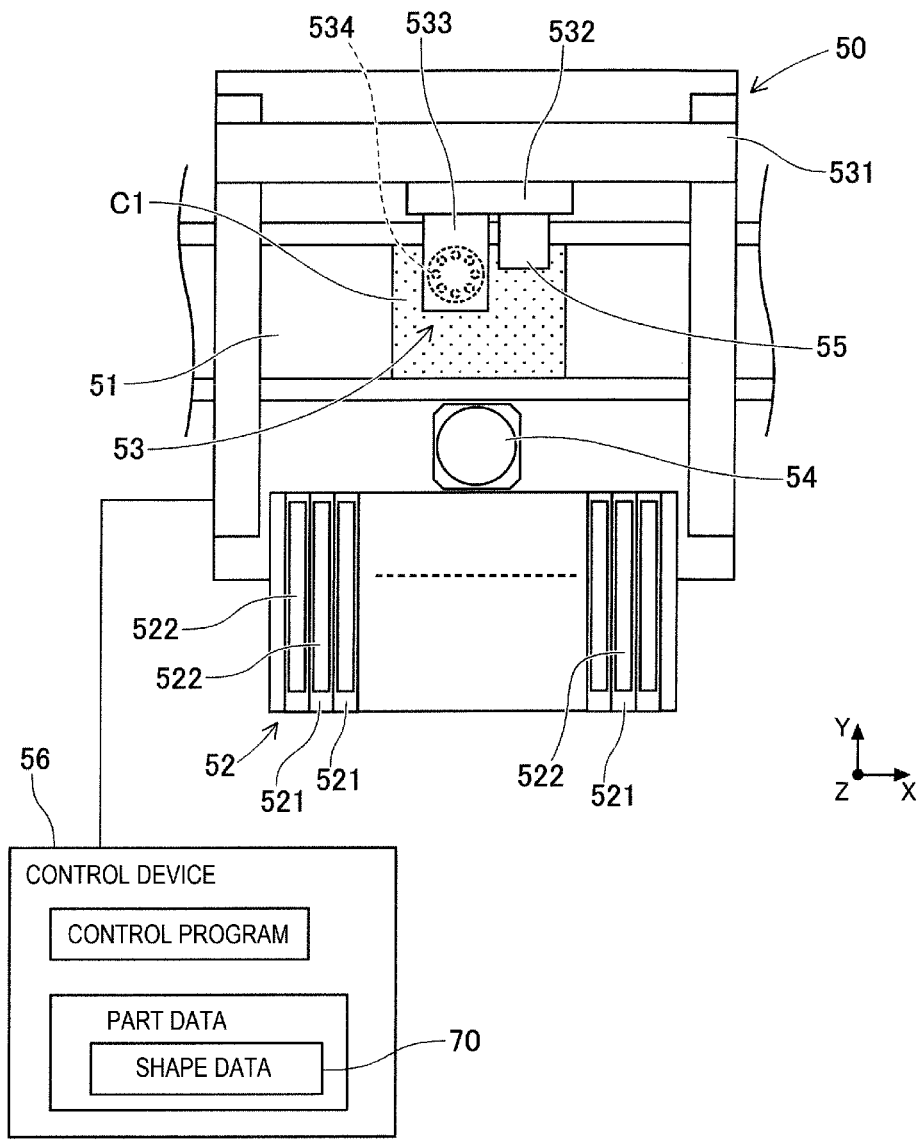
FIG. 2 is a schematic diagram illustrating a configuration of a component mounter.

As illustrated in FIG. 2, component mounter 50 includes board conveyance device 51. Board conveyance device 51 sequentially conveys board C1 in a conveyance direction and positions board C1 at a predetermined position in the machine. Component mounter 50 includes component supply device 52. Component supply device 52 supplies a component to be mounted onto board C1. In component supply device 52, feeders 522 are respectively set in multiple slots 521. Feeders 522 feed and move a carrier tape in which multiple components are housed, so as to collectably supply the components.

Component mounter 50 includes component transfer device 53. Component transfer device 53 transfers components supplied by component supply device 52 to a predetermined mounting position on board C1. Component transfer device 53 includes head drive device 531, movement table 532, mounting head 533, and suction nozzle 534. Head drive device 531 moves movement table 532 in a horizontal direction (an X direction and a Y direction) by a linear motion mechanism. Mounting head 533 is detachably provided to movement table 532 by a clamp member (not illustrated).

Mounting head 533 supports multiple suction nozzles 534 so as to be rotatable and to be movable up and down. Suction nozzles 534 are holding members that hold collected components. Suction nozzles 534 pick up components supplied by feeder 522 by supplied negative pressure air. As a holding member to be attached to mounting head 533, a chuck or the like that holds a component by gripping the component can be employed.

Here, various types of mounting heads 533 can be employed in mounting head 533 described above. Specifically, mounting head 533 has a type in which multiple holding members are supported by a rotary head rotatably provided around an R axis parallel to a vertical axis (a Z axis). Further, mounting head 533 has a type that supports multiple holding members arranged in a straight line or a matrix, a type that supports one holding member, and the like. The type of mounting head 533 can be appropriately selected according to, for example, the type or the like of board products to be produced.

Component mounter 50 includes component camera 54 and board camera 55. Component camera 54 and board camera 55 are digital type imaging devices including an imaging element such as CMOS. Component camera 54 and board camera 55 capture an image based on a control signal and transmit image data acquired by the imaging. Component camera 54 can capture an image of a component held by suction nozzle 534 from below. Board camera 55 is provided on movement table 532 so as to be movable in a horizontal direction integrally with mounting head 533. Board camera 55 can capture an image of board C1 from above.

Component mounter 50 includes control device 56. Control device 56 is mainly configured by CPU, various memories, and a control circuit. Control device 56 includes a storage device (not illustrated). The storage device is configured by an optical drive device such as a hard disk device, a flash memory, or the like. A control program used for controlling a mounting process, and various data such as shape data 70 are stored in the storage device of control device 56. The control program indicates a mounting position and a mounting sequence of a component to be mounted onto board C1 in the mounting process.

Control device 56 performs a recognition process of a holding state of a component held by each of multiple holding members (suction nozzle 534). Specifically, control device 56 performs image processing of image data acquired by component camera 54 and recognizes a position and an angle of each component for a reference position of mounting head 533. At this time, control device 56 determines whether a component to be mounted is suitable among components included in the image data, based on a component shape defined by shape data 70. Details of shape data 70 will be described below.

In addition to component camera 54, control device 56 may perform image processing of image data acquired by capturing an image of a component from the side, the bottom, or the top by, for example, a head camera unit or the like provided integrally with mounting head 533. Control device 56 performs a mounting process by controlling a mounting operation of a component by mounting head 533, based on a control program. Here, the mounting process includes a process of repeating a pick-and-place cycle (hereinafter, referred to as a "PP cycle") including a collection operation and a mounting operation multiple times.

The "collection operation" is an operation of collecting components supplied by component supply device 52 by using multiple suction nozzles 534. The "mounting operation" is an operation of mounting collected components to predetermined mounting positions on board C1. In the mounting process, control device 56 controls an operation of mounting head 533 based on information output from various sensors, a result of image processing, a control program, and the like. Thereby, positions and angles of multiple suction nozzles 534 supported by mounting head 533 are controlled.

3. Shape Data 70

Figure 3:
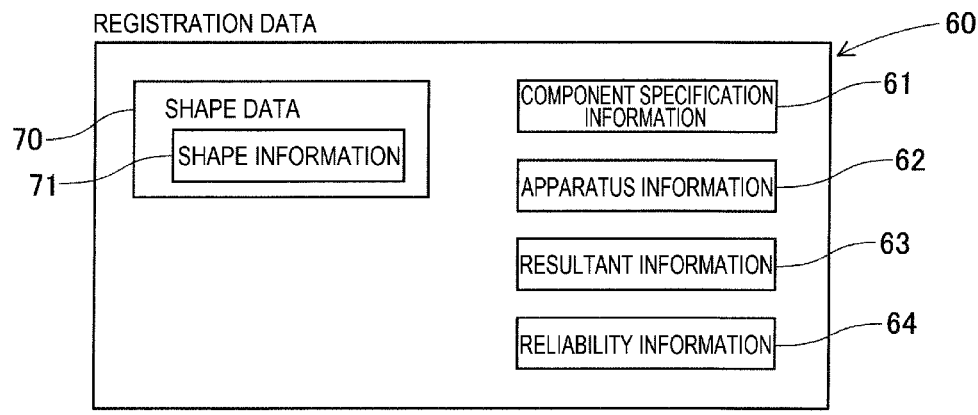
FIG. 3 illustrates registration data.

Shape data 70 includes shape information 71 of a component (refer to FIG. 3). The "shape information" includes, for example, items such as sizes of vertical and horizontal heights of a component, an allowable error (tolerance) of each size, an appearance shape, and an appearance color. Further, when a component is a lead component, the "shape information" includes items such as a position of a lead, a shape of the lead, an allowable flatness of a lead end. Further, shape data 70 can include imaging conditions such as exposure time, a light source type, and light emission time of the light source when component camera 54 performs an imaging process.

Shape data 70 defines a component shape according to shape information 71 described above. Shape data 70 is used for, for example, a recognition process of a holding state of a component. At this time, accuracy or a process load of the recognition process can be affected by shape data 70 used in the recognition process. That is, by applying appropriate shape data 70 to image processing such as a recognition process, suitability and a posture of a component held by suction nozzle 534 is accurately recognized.

Due to the circumstances, shape data 70 is adjusted for, for example, general-purpose initial data based on a production environment, an inspection result after a mounting process is performed, and the like. Thus, multiple types of shape data 70 may be generated for components of the same type (model). For example, the type of shape data 70 suitable for various types of a process can be generated in consideration of required accuracy for a mounting process and a load of image processing. Furthermore, the type of shape data 70 suitable for a production condition and various circumstances can be generated in consideration of correspondence to a configuration device applied to production and a difference between manufacturers of components.

Further, shape data 70 configures part data. The "part data" includes handling information of a component and information indicating a supply mode of a component. The "handling information of a component" includes, for example, a position and a range with which a holding member comes into contact when the component is held, an allowable value of acceleration and deceleration when the held component is transferred, and the like. The "supply mode of a component" indicates whether a component is supplied by being housed in a carrier tape or a stick, or whether the component is supplied in a bulk state, or the like.

4. Configuration of Data Management System 1

As described above, shape data 70 used in a mounting process is generated by a producer according to a production environment and the like of the producer and is adjusted based on usage results or the like thereafter. Multiple shape data 70 edited multiple times are preferably managed for each type together with, for example, the type of an applicable mounting process (corresponding to the type of a board product) and information indicating a combination of configuration devices capable of performing the mounting process.

Therefore, data management system 1 is configured in an aspect exemplified below with shape data 70 as a management target. Thereby, data management system 1 can perform addition to a management target of generated or edited shape data 70, and deletion from a management target of unnecessary shape data 70. Further, in the present embodiment, data management system 1 can provide shape data 70 according to a request.

4-1. Data Server 10

As illustrated in FIG. 1, data management system 1 includes data server 10. Data server 10 allows data access by multiple users. For example, data server 10 is a cloud server connected to a terminal device of a user via the Internet.

Data server 10 includes first storage section 11. First storage section 11 configures data server 10 together with a server control section (not illustrated). First storage section 11 constructs a database capable of sharing various types of data including multiple shape data 70. When storing shape data 70, first storage section 11 stores registration data 60 in which component specifying information 61 is associated with shape data 70, as illustrated in FIG. 3. Details of registration data 60 will be described below.

Data server 10 accumulates registration data 60 uploaded from each of multiple production management devices 20. Further, data server 10 limits the number of pieces of registration data 60 in the database based on a predetermined criterion in consideration of storage capacity of first storage section 11. At this time, data server 10 performs a deletion process based on various types of information included in registration data 60 (described below) and associated with shape data 70 such that better data remains.

4-2. Configuration of Registration Data 60

Component specifying information 61 associated with registration data 60 is information for specifying a component. Component specifying information 61 is used to specify the type of component to which shape data 70 is to be applied. Generally, component specifying information 61 includes at least one of model information of a component and manufacturer information of the component. The model information of the component is assigned, for example, by a manufacturer of the component. The manufacturer information includes a manufacturer name of the component, an abbreviation or a symbol indicating the manufacturer name of the component, and the like.

In addition to this, a standard designation can be applied to component specifying information 61. Further, image data acquired by capturing an image of a component or an icon generated based on the image data can be applied to component specifying information 61. Furthermore, when data management system 1 is used only for a specific producer, in-house designation uniquely set by the producer may be used as component specifying information 61.

In the present embodiment, registration data 60 includes device information 62 indicating a configuration device associated with shape data 70 and capable of performing a mounting process by using shape data 70. That is, the configuration device indicated by device information 62 can be applied to the mounting process using shape data 70 with which device information 62 is associated.

Device information 62 indicates a name, a model, a specification, and performance of a configuration device with a character string, a symbol, or the like. For example, device information 62 may indicate multiple models of mounting head 533 as a configuration device capable of performing a mounting process or may indicate one or more models of mounting head 533 applied to the mounting process performed previously. Further, a manufacturer name, a model, a specification, and performance of component mounter 50 performed the mounting process may be indicated in device information 62 by a character string or a symbol.

Furthermore, information indicating an application level for a configuration device may be added to device information 62. The "application level" includes a level such as whether a configuration device is an indispensable device, whether recommendation includes compatibility with other configuration devices, or whether the configuration device used previously is simply indicated, when shape data 70 is applied to a mounting process.

In the present embodiment, registration data 60 includes resultant information 63 that is associated with shape data 70 and indicates usage results of shape data 70 used in the mounting process. The "usage results" may be the number of times that shape data 70 is used in a predetermined mounting process or may be the number of times that shape data 70 is used in image processing in the mounting process. The number of times used for the image processing substantially corresponds to the number of times that a mounting operation of a component corresponding to shape data 70 is performed in the mounting process. When associated shape data 70 is edited by adjustment or the like, resultant information 63 indicates the number of uses that is counted again by resetting the usage results.

In the present embodiment, registration data 60 includes reliability information 64 that is associated with shape data 70 and indicates work reliability based on a performing result of a mounting process using shape data 70. The "work reliability" is an index indicating accuracy in various works such as image processing using shape data 70. For example, when the work reliability is low, the frequency of occurrence of a work error (for example, an error of determining an appropriate component as an inappropriate component) caused by shape data 70 in the image processing is relatively high.

In the present embodiment, reliability information 64 indicates at least one of a collection success rate and a mounting success rate as work reliability. The "collection success rate" indicates a probability that a holding member holding a component can appropriately collect the component in a mounting process. In more detail, the collection success rate is a success rate of a collection operation using shape data 70. The picking success rate corresponds to a probability that a component is appropriately picked up, for example, when suction nozzle 534 serving as a holding member has attempted to pick up the component recognized by shape data 70.

The "mounting success rate" indicates a probability that a holding member can appropriately mount a component onto board C1. In more detail, the mounting success rate is a success rate of a mounting operation based on a result of a recognition process of a holding state of a component using shape data 70. The mounting success rate corresponds to a probability that a component is appropriately mounted, for example, when suction nozzle 534 serving as a holding member performs mounting based on a result of a recognition process of a holding state. Whether mounting is successful is recognized by, for example, inspection of board C1 after the mounting is performed.

4-3. Production Management Device 20

As illustrated in FIG. 1, data management system 1 includes production management device 20. Production management device 20 collectively manages a board work machine such as component mounter 50 configuring a production line for producing a board product. Further, data management system 1 may include multiple production management devices 20. Multiple production management devices 20 may be respectively provided to multiple factories possessed by the same producer or different producers. Each of multiple production management devices 20 can transmit and receive shape data 70 via data server 10.

4-3-1. Second Storage Section 21

Data management system 1 includes second storage section 21 in production management device 20. Second storage section 21 stores a control program, part data including shape data 70, possession device data 81, production plan D1, allocation information D2, and the like. Here, the "possession device data 81" indicates a configuration device possessed by a producer who produces a board product by using component mounter 50 and exchangeably equipped in component mounter 50, as illustrated in FIG. 4.

Specifically, the "configuration device" includes a holding member for holding a component, suction nozzles 534, mounting head 533, feeders 522, component camera 54, board camera 55, and a head camera unit. The configuration device is an device that can cause a difference in an operation in a mounting process or a difference in acquired image data due to a change in the type equipped in component mounter 50.

Possession device data 81 may include information on a version of software installed in the configuration device. Specifically, for example, when a configuration device includes a control section for controlling a drive section driven by supplied electric power such as mounting head 533 or feeders 522, possession device data 81 includes information indicating a version of software installed in the control section and an update history of the software. Furthermore, possession device data 81 may include a history of maintenance and usage results of each of the multiple configuration devices.

Production plan D1 indicates a type and a production sequence of a board product to be produced by using component mounter 50. In addition to the above-described items, production plan D1 may indicate items such as the planned number of products, a planned start time of production, and a planned end time of production for each type of board products. Allocation information D2 indicates allocation of configuration devices to be used for each production of board products. Specifically, allocation information D2 indicates mounting head 533 and suction nozzles 534 used in a predetermined mounting process by using an identification code or the like. Allocation information D2 is used for an operator to setup change of component mounter 50.

4-3-2. Search Section 22

Here, shape data 70 used for a mounting process by component mounter 50 is adjusted based on usage results or the like as described above and accumulated in first storage section 11 of data server 10. Then, for example, when performing of a new mounting process is planned, it is conceivable to acquire shape data 70 used for a similar mounting process performed previously and to edit shape data 70. Therefore, data management system 1 includes search section 22 in production management device 20. Search section 22 searches registration data 60 including shape data 70 from first storage section 11 by using predetermined search condition 91.

Search section 22 searches registration data 60 from first storage section 11 by using partial information included in at least one of shape data 70 and component specifying information 61, as search condition 91. That is, as illustrated in FIG. 4, search conditions 91 is set by a numerical value, a range, a character string, a symbol, or the like for one or more items selected from shape information of shape data 70 (a vertical-horizontal height size of a component, an allowable error (tolerance) of each size, an appearance shape, and the like) and various types of information of component specifying information 61 (model information of a component, manufacturer information of the component, and the like). Specifically, search section 22 searches registration data 60 by using model information of a component set by an operator as search condition 91.

Further, search section 22 may search registration data 60 by including usage results indicated by resultant information 63 in search condition 91 during a search process. Specifically, search section 22 searches registration data 60 by including, for example, an item representing that the number of times used for image processing set by an operator is N1 or more in search condition 91. Further, search section 22 may search registration data 60 by including work reliability represented by reliability information 64 in search condition 91 during the search process. Specifically, search section 22 searches registration data 60 by including an item representing that a mounting success rate set by an operator is N2% or more in search condition 91.

4-3-3. Determination Section 23

Here, when multiple shape data 70 is stored in first storage section 11, multiple pieces of shape data 70 can be acquired as a search result. In such a case, it is necessary to determine whether multiple shape data 70 are applicable to a mounting process to be performed. Further, shape data 70 acquired as a result of the search may be limited to a predetermined production environment when applied to the mounting process.

Specifically, in order to apply predetermined shape data 70 to the mounting process, it may be conditioned that component mounter 50 is equipped with designated types of mounting head 533, suction nozzle 534, and component camera 54. Accordingly, even when predetermined shape data 70 is acquired, shape data 70 cannot be used unless a corresponding configuration device is possessed.

In contrast to this, when searching registration data 60, it is not easy to input information on a previously assumed production environment even from a viewpoint of the amount of information and the amount of work. Even when information on a production environment is input, when a difference occurs between the information and an actual production environment according to a change in the production environment, an error can be included in a search result. Therefore, data management system 1 includes determination section 23 in production management device 20.

Determination section 23 performs a suitability determination process for determining, based on possession device data 81, whether shape data 70 included in registration data 60 of a search result obtained by search section 22 is suitable for a mounting process using a configuration device. Here, the "mounting process using a configuration device" in the suitability determination process is a mounting process that can be performed by arbitrarily combining a predetermined configuration device. The "predetermined configuration device" includes a configuration device included in possession device data 81, and a configuration device derived from shape data 70, component specifying information 61, and device information 62.

Hereinafter, assuming a production environment in which a predetermined configuration device is used for a mounting process, a "mounting process using a predetermined configuration device" will be simply described a "mounting process". For example, "whether shape data 70 is suitable for a mounting process using a predetermined configuration device" is simply described as "whether shape data 70 is suitable for a mounting process". Determination section 23 recognizes a configuration device possessed by a producer indicated by possession device data 81, and, for example, when shape data 70 is limited to a predetermined production environment, whether the mounting process can be performed within a range of the limitation is determined.

Further, as in the present embodiment, when device information 62 is associated with shape data 70 in registration data 60, determination section 23 performs a suitability determination process based on device information 62 associated with possession device data 81 and shape data 70. Thereby, determination section 23 can perform the suitability determination process by adding a configuration device necessary for application of shape data 70 and a configuration device applied previously.

Here, possession device data 81 can include a configuration device that is possessed by a producer but cannot be used for a mounting process due to predetermined circumstances. The predetermined circumstances are assumed to include circumstances such as being planned to be used or being used for another mounting process different from a mounting process to be performed, or maintenance being planned to be performed or being performed. Therefore, determination section 23 may perform a suitability determination process, based on determination condition 92 indicating whether each of multiple configuration devices included in possession device data 81 is set as a determination target in the suitability determination process.

Determination section 23 causes an operator to present, for example, content of possession device data 81, and receives setting of whether to set a determination target in the suitability determination process for each configuration device. Determination section 23 sets a result of the above-described setting as determination condition 92. Then, determination section 23 performs a suitability determination process for a search result acquired by search section 22, based on determination condition 92 and possession device data 81. Thereby, shape data 70 that is not actually applicable due to predetermined circumstances or the like may be prevented from being determined to be suitable for a mounting process to be performed.

Determination condition 92 may be automatically set based on production plan D1 and allocation information D2 in addition to being manually set by an operator as described above. Production plan D1 indicates a production sequence of board products, and allocation information D2 indicates allocation of configuration devices used for each production of the board products. Thus, it is possible to figure out a period during which a predetermined configuration device is planned to be used, a period during which the configuration device is housed in a warehouse, a period during which maintenance is performed, and the like, based on production plan D1 and allocation information D2.

Therefore, data management system 1 automatically sets determination condition 92 based on production plan D1 and allocation information D2 so as to be determinable whether shape data 70 is suitable for a mounting process planned to be performed at a predetermined period. Thereby, determination section 23 can perform the suitability determination process by adding determination condition 92. As a result, shape data 70 that is not actually applicable can be prevented from being acquired from first storage section 11.

Here, in the suitability determination process, whether shape data 70 is suitable for a mounting process to be performed is determined over multiple items, or whether some items are within an applicable range is determined. By doing so, multiple shape data 70 may include shape data 70 having high suitability such as results of being applied to a similar mounting process performed previously, and shape data 70 that is usable but located near a boundary of an applicable range in a predetermined determination item.

Therefore, determination section 23 calculates a suitable level for a mounting process for each of multiple shape data 70 in the suitability determination process. The "suitable level" is an index indicating a suitable level or unsuitability for a mounting process of a target in addition to whether shape data 70 is suitable for the mounting process. When an ideal configuration device is designated in applying predetermined shape data 70 and the configuration device is included in possession device data 81, determination section 23 calculates the suitable level of shape data 70 so as to be high.

Meanwhile, when the ideal configuration device is not included in possession device data 81 but a replaceable compatible device is included in possession device data 81, determination section 23 calculates the suitable level of shape data 70 so as to be low but to be suitable. Further, determination section 23 may calculate the suitable level only when shape data 70 is suitable for a mounting process to be performed or may calculate the suitable level in the same manner even when shape data 70 is not suitable.

Further, a predetermined production environment applied to shape data 70 may include a version of software installed in a configuration device. In such a case, determination section 23 performs the suitability determination process by using information of the version of the software included in possession device data 81. Determination section 23 may reflect the version of the software of the configuration device in calculation of the suitable level.

4-3-4. Presentation Section 24

Here, as a result of a search process by search section 22, one or more pieces of registration data 60 satisfying search condition 91 may be obtained. Furthermore, as a result of the suitability determination process by determination section 23, one or more pieces of shape data 70 suitable for a mounting process to be performed may be obtained. Therefore, in the present embodiment, data management system 1 includes presentation section 24 in production management device 20. Presentation section 24 presents a determination result obtained by determination section 23 to an operator so as to be checkable.

Specifically, for example, as illustrated in FIG. 6, presentation section 24 displays shape data 70 on a display device such that an operator can visually recognize shape data 70 as a determination result by determination section 23. At this time, when multiple shape data 70 suitable for a mounting process are included in the determination result by determination section 23, presentation section 24 may also present a recommendation level of application of each of the multiple pieces of shape data 70 to the mounting process according to the suitable level. At this time, determination section 23 may present shape data 70 with a higher recommendation level so as to be higher.

Further, presentation section 24 may present together with a configuration device that is insufficient for shape data 70 to be suitable for the mounting process, to shape data 70 determined by determination section 23 to be not suitable for the mounting process. Even when shape data 70 is determined to be unsuitable by determination section 23, there may be excellent shape data 70 that can be adapted by supplementing a predetermined configuration device. In such a case, presentation section 24 may present information for resolving a reason together and the reason for unsuitability.

Specifically, presentation section 24 presents, for example, model information and the like of suction nozzles 534 so as to prompt purchase of predetermined suction nozzle 534. Further, a reason for unsuitability can include a case where software installed in a control section of a configuration device is not updated even though the configuration device is possessed by a producer. In such a case, presentation section 24 presents a fact that the configuration device is unsuitable, and performing of a maintenance process such as version-up of the software installed in the configuration device.

4-3-5. Editing Section 25

Here, possession device data 81 indicates a configuration device currently possessed by a producer and is edited appropriately and manually by a manager or the like of the configuration device. At this time, when there is an editing error by the manager, a possession state indicated by possession device data 81 may be different from an actual possession state. Therefore, in the present embodiment, data management system 1 includes editing section 25. Editing section 25 edits possession device data 81 stored in second storage section 21 based on information indicating addition and discarding of a configuration devices possessed by a producer.

Here, for example, when a new configuration device is introduced, information such as an identification code, a type, and an introduction date of the configuration device is input to production management device 20. Further, when a configuration device is carried out from a warehouse, carried in a warehouse, used for a mounting process, subjected to a maintenance process, or the like, such information is input to production management device 20. Furthermore, when a configuration device is discarded, information such as an identification code and a discard date of the configuration device is input to production management device 20.

Therefore, editing section 25 automatically edits possession device data 81 based on the information on the configuration device input to production management device 20 as described above. Thereby, it is possible to prevent a possession state indicated by possession device data 81 from being different from an actual possession state. As a result, accuracy of a suitability determination process by determination section 23 can be increased.

4-3-6. Uploading of Registration Data 60

Production management device 20 configuring data management system 1 uploads registration data 60 including shape data 70 to data server 10 as described above. Production management device 20 associates component specifying information 61 or the like with shape data 70 to generate registration data 60 at a predetermined timing. Then, production management device 20 uploads generated registration data 60 to data server 10.

A timing when production management device 20 uploads registration data 60 is assumed to be, for example, randomness of a manager of shape data 70, a timing when shape data 70 is determined to satisfy a predetermined registration criterion, a timing when there is a request for shape data 70 from another sharer, and the like. Further, examples of the registration criterion include a picking success rate and a mounting success rate which are greater than or equal to a prescribed value. Further, production management device 20 may upload registration data 60 based on an increase in the picking success rate, the mounting success rate, and work reliability.

Further, production management device 20 generates registration data 60 so as not to include information that is not related to a shape and that a producer does not want publication among the information included in shape data 70. Examples of the information that is not desired to be published include marketing information assigned to shape data 70 for the purpose of facilitating convenience in an enterprise of a producer or the like, and information on know-how.

As described above, shape data 70 uploaded to data server 10 is data having a result used in a mounting process of a component and may be limited to data of which publication is approved by a producer. Then, by accumulating shape data 70 as registration data 60 in data server 10, shape data 70 is shared such that multiple consumers can use each other.

5. Search Process of Shape Data 70

Figure 5:
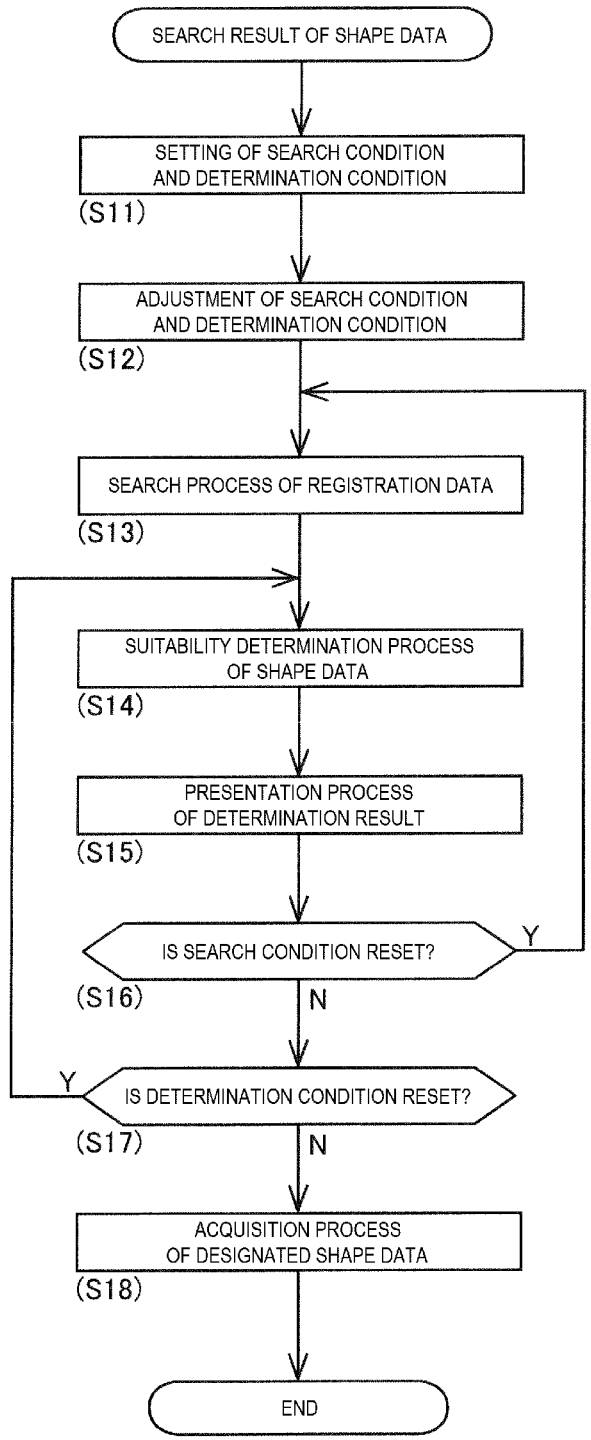
FIG. 5 is a flowchart illustrating a process of searching for shape data.

A search process of shape data 70 by data management system 1 will be described with reference to FIGS. 4 to 6. First, as illustrated in FIG. 5, data management system 1 receives settings of search condition 91 and determination condition 92 by an operator who needs shape data 70 (S11). Thereby, as illustrated in FIG. 4, for example, model information of a component, vertical and horizontal sizes of a component, and the like are set as search condition 91. Set search condition 91 and set determination condition 92 are stored in second storage section 21.

Next, search section 22 performs an adjustment process of search condition 91 and determination condition 92 (S12). Here, when resultant information 63 and reliability information 64 are associated with shape data 70 in registration data 60, usage results and work reliability may be required to be added to the search process. In such a case, search section 22 adjusts search condition 91 including the usage results and the work reliability. Further, when there is a request for automatic setting of determination condition 92, search section 22 adjusts determination condition 92 based on production plan D1 and allocation information D2.

Subsequently, search section 22 searches first storage section 11 for registration data 60 by using search condition 91 (S13). When there is no shape data 70 satisfying search condition 91, data management system 1 notifies, for example, an operator to change gist thereof and search condition 91. Here, it is assumed that registration data 60 including multiple shape data 70 satisfying search condition 91 is detected.

Determination section 23 performs a suitability determination process (S14). In detail, determination section 23 determines, based on possession device data 81, whether a mounting process can be performed by using a configuration device possessed by a producer for each piece of shape data 70 included in one or more pieces of registration data 60 detected by the search process (S13). Thereby, whether each piece of shape data 70 is suitable for the mounting process is determined.

In more detail, when device information 62 is associated with shape data 70 in registration data 60, determination section 23 performs a suitability determination process by collating configuration devices respectively indicated by device information 62 and possession device data 81. Further, when determination condition 92 is set, determination section 23 performs the suitability determination process by adding determination condition 92. Furthermore, in the suitability determination process, determination section 23 calculates a suitable level for the mounting process for each piece of shape data 70.

Presentation section 24 performs a presentation process of a determination result (S15). Specifically, as illustrated in FIG. 6, presentation section 24 displays shape data 70 that satisfies search condition 91 and is suitable for the mounting process using a possessed configuration device. At this time, presentation section 24 may display shape information indicated by shape data 70 together with component specifying information 61, device information 62, resultant information 63, and reliability information 64 associated with shape data 70. Further, presentation section 24 may switch between display and non-display of such information in response to a request from an operator.

Furthermore, when multiple shape data 70 is suitable, presentation section 24 may present shape data 70 such that the higher the recommendation level of application to the mounting process according to the suitable level for each piece of shape data 70, the higher the level. Further, presentation section 24 presents, in a separate column, a reason why shape data 70 determined to be unsuitable for the mounting process using the possessed configuration device is unsuitable, as well as information for resolving the reason. Thereby, an operator is prompted to introduce insufficient configuration devices, perform a maintenance process of the configuration devices, and the like.

When multiple shape data 70 is presented as described above, data management system 1 is in a state where resetting of search condition 91, resetting of determination condition 92, and designation of shape data 70 to be acquired by an operator can be received. When resetting of search condition 91 is made (S16: Yes), data management system 1 performs step S13 to step S15 again. Further, when resetting of determination condition 92 is made (S16: No, S17: Yes), data management system 1 performs step S14 and step S15 again.

When designation of shape data 70 to be acquired is received (S17: No), data management system 1 performs an acquisition process of designated shape data 70 (S18). Specifically, one or more shape data 70 is downloaded from first storage section 11 of data server 10 to production management device 20. Acquired shape data 70 is stored in second storage section 21 and is edited according to a mounting process to be performed and a configuration device as required.

According to the configuration described above, it is possible to obtain a determination result as to whether shape data 70 is suitable for a mounting process based on possession device data 81 stored in advance when shape data 70 is searched. Thereby, it is possible to simplify setting of a search condition when searching shape data 70, and to prevent a setting error of the search condition. Thus, convenience of a data management system capable of searching for shape data 70 can be increased.

6. Modification Aspect of Embodiment

6-1. Configuration of Data Management System 1

In the embodiment, data management system 1 has a configuration in which first storage section 11 is provided in data server 10 in order to share shape data 70. In contrast to this, data management system 1 may be merely used for managing multiple pieces of shape data 70 by the same producer and may have, for example, a configuration in which first storage section 11 is provided in production management device 20. At this time, first storage section 11 and second storage section 21 may be configured as the same storage device.

Further, data management system 1 has a configuration in which registration data 60 obtained by associating various types of information with shape data 70 is stored in first storage section 11. In contrast to this, data management system 1 may have registration data 60, which is obtained by associating various types of information with part data including shape data 70, as a management target. Even in such a configuration, the same effect as in the embodiment is obtained.

6-2. Possession Device Data 81, Determination Condition 92, and Configuration Device In the embodiment, possession device data 81 is manually edited by an operator or automatically edited by editing section 25. Possession device data 81 indicates a configuration device possessed by a producer as described above, and in other words, indicates a production environment applicable to a mounting process. Thus, possession device data 81 may be appropriately edited in at least one of a manual mode and an automatic mode as long as a suitability determination process can be appropriately performed by determination section 23. Likewise, determination condition 92 may be appropriately set in at least one of a manual mode and an automatic mode.

Further, in the embodiment, the configuration device is described by exemplifying an aspect in which mounting head 533 and suction nozzles 534 are provided. In contrast to this, the configuration device can use various devices if the devices cause differences in a pick-up operation, a mounting operation, and acquired image data in a mounting process when exchanged with another one. Further, as described in the embodiment, when types or versions of installed software are different from each other even in the same configuration device, data management system 1 may treat those configuration devices as another configuration device.

6-3. Presentation Section 24

In the embodiment, presentation section 24 visually displays results of a search process (S13) and a suitability determination process (S14) to an operator. In contrast to this, data management system 1 may have a configuration in which presentation section 24 is omitted. Specifically, data management system 1 may perform the search process (S13) and the suitability determination process (S14) to acquire all shape data 70 with suitability or may output shape data 70 to a predetermined communication destination.

REFERENCE SIGNS LIST

1: data management system, 10: data server, 11: first storage section, 20: production management device, 21: second storage section, 22: search section, 23: determination section, 24: presentation section, 25: editing section, 50: component mounter, 522: feeder (configuration device), 533: mounting head (configuration device), 534: suction nozzle (configuration device), 54: component camera (configuration device), 55: board camera (configuration device), 60: registration data, 61: component specifying information, 62: device information, 63: resultant information, 64: reliability information, 70: shape data, 71: shape information, 81: possession device data, 91: search condition, 92: determination condition, D1: production plan, D2: allocation information, C1: board

The invention claimed is:

1. A data management system that is used in a mounting process of a component by a component mounter and uses shape data including shape information of the component as a management target, the data management system comprising:
   a data server configured to allow data access by multiple users, the data server including
      a first storage section configured to store registration data in which component specifying information for specifying the component is associated with the shape data, the registration data including device information associated with the shape data and indicating a type of configuration device of the component mounter capable of performing the mounting process by using the shape data; and
   a production management device in communication with the data server and configured to manage the component mounter, the production management device including
      a second storage section configured to store possession device data possessed by a producer who produces a board product by using the component mounter, the possession device data indicating a configuration device exchangeably equipped in the component mounter; and
      a search section configured to search the registration data from the first storage section by using partial information included in at least one of the shape data and the component specifying information as a search condition; and
      a determination section configured to perform a suitability determination process of determining whether the shape data included in the registration data in a search result by the search section is suitable for the mounting process using the configuration device, based on the possession device data and the device information by collating configuration devices respectively indicated by the device information and the possession device data, and a determination condition indicating whether each of multiple configuration devices included in the possession device data is used as a determination target in the suitability determination process, the determination condition being edited based on a production plan indicating a type and a production sequence of the board product produced by using the component mounter, and allocation information indicating allocation of the configuration devices used for each production of the board product.

2. The data management system according to claim 1, wherein the registration data includes resultant information associated with the shape data and indicating usage results of the shape data used in the mounting process, and
the search section searches the registration data by including the usage results indicated in the resultant information in the search condition.

3. The data management system according to claim 1, wherein the registration data includes reliability information associated with the shape data and indicating work reliability based on a performing result of the mounting process using the shape data, and
the search section searches the registration data by including the work reliability indicated by the reliability information in the search condition.

4. The data management system according to claim 3, wherein the reliability information indicates, as the work reliability, at least one of a picking success rate indicating a probability that a holding member holding the component appropriately picks up the component in the mounting process, and a mounting success rate indicating a probability that the holding member appropriately mounts the component onto a board.

5. The data management system according to claim 1, wherein the production management device further comprises a presentation section configured to present a determination result by the determination section for an operator to be checkable.

6. The data management system according to claim 5, wherein the determination section calculates a suitable level for the mounting process for each of multiple pieces of the shape data in the suitability determination process, and
the presentation section also presents a recommendation level of application of each of the multiple pieces of the shape data to the mounting process according to the suitable level when multiple pieces of the shape data suitable for the mounting process are included in the determination result by the determination section.

7. The data management system according to claim 5, wherein the presentation section presents the shape data determined by the determination section to be unsuitable for the mounting process, together with the configuration device that is insufficient for the shape data to be suitable for the mounting process.

8. The data management system according to claim 1, wherein the production management device further comprises an editing section configured to edit the possession device data stored in the second storage section based on information indicating addition and discarding of the configuration device possessed by the producer.

9. The data management system according to claim 1, wherein the component specifying information includes at least one of model information of the component and manufacturer information of the component.

10. The data management system according to claim 1, wherein the configuration device is at least one of a holding member for holding the component, a suction nozzle for picking up the component by negative pressure air in the holding member, a mounting head for supporting the holding member so as to be movable up and down and to be rotatable, a feeder for supplying the component, a component camera capable of capturing an image of the component held by the holding member, and a board camera capable of capturing an image of a board on which the component is mounted.

* * * * *